(12) United States Patent
McDannald et al.

(10) Patent No.: US 11,524,365 B2
(45) Date of Patent: Dec. 13, 2022

(54) INERT GAS-ASSISTED LASER MACHINING OF CERAMIC-CONTAINING ARTICLES

(71) Applicant: M Cubed Technologies, Inc., Newtown, CT (US)

(72) Inventors: Austin Scott McDannald, Ansonia, CT (US); Daniel Mastrobattisto, Milford, CT (US); Michael K. Aghajanian, Newark, DE (US); Edward J. Gratrix, Monroe, CT (US)

(73) Assignee: II-VI DELAWARE, INC., Wilmington, DE (US)

( * ) Notice: Subject to any disclaimer, the term of this patent is extended or adjusted under 35 U.S.C. 154(b) by 511 days.

(21) Appl. No.: 16/671,160

(22) Filed: Oct. 31, 2019

(65) Prior Publication Data

US 2020/0230747 A1    Jul. 23, 2020

Related U.S. Application Data

(63) Continuation of application No. PCT/US2018/030749, filed on May 2, 2018.
(Continued)

(51) Int. Cl.
*B23K 26/14* (2014.01)
*B23K 26/16* (2006.01)
(Continued)

(52) U.S. Cl.
CPC .......... *B23K 26/355* (2018.08); *B23K 26/032* (2013.01); *B23K 26/0624* (2015.10);
(Continued)

(58) Field of Classification Search
CPC .............. B23K 26/02; B23K 26/035; B23K 26/08–0821; B23K 26/14–142; B23K 26/16; B23K 26/32–324; B23K 26/351; B23K 26/352–355; B23K 26/36–361; B23K 26/40–402
See application file for complete search history.

(56) References Cited

U.S. PATENT DOCUMENTS

| 5,744,780 A | * | 4/1998 | Chang ................. B23K 26/389 |
| | | | 219/121.73 |
| 9,543,187 B2 | | 1/2017 | Cooke |

(Continued)

FOREIGN PATENT DOCUMENTS

| JP | 2006122989 A | 5/2006 |
| JP | 2011521470 A | 7/2011 |

(Continued)

OTHER PUBLICATIONS

English translation of WO2016009103 to Pou Saracho (Year: 2016).*
(Continued)

*Primary Examiner* — Michael A Laflame, Jr.
(74) *Attorney, Agent, or Firm* — Blank Rome LLP

(57) ABSTRACT

An article includes a ceramic material and features a machined surface that is characteristic of cold ablation laser machining, and the machined surface exhibits no visible oxidation. A laser machining apparatus and technique is based on cold-ablation, but is modified or augmented with an inert assist gas to minimize deleterious surface modifications and mitigate oxide formation associated with laser machining.

7 Claims, 15 Drawing Sheets

Related U.S. Application Data

(60) Provisional application No. 62/500,482, filed on May 2, 2017, provisional application No. 62/500,491, filed on May 2, 2017.

(51) Int. Cl.

| | | |
|---|---|---|
| *B23K 26/40* | (2014.01) | |
| *B23K 26/352* | (2014.01) | |
| *B23K 26/364* | (2014.01) | |
| *B23K 26/03* | (2006.01) | |
| *B23K 26/0622* | (2014.01) | |
| *B23K 26/08* | (2014.01) | |
| *B23K 26/10* | (2006.01) | |
| *B23K 26/12* | (2014.01) | |
| *B23K 26/362* | (2014.01) | |
| *B23K 26/402* | (2014.01) | |
| *C04B 41/00* | (2006.01) | |
| *C04B 41/53* | (2006.01) | |
| *C04B 41/91* | (2006.01) | |
| *H01L 21/687* | (2006.01) | |
| *B23K 26/36* | (2014.01) | |
| *B23K 103/00* | (2006.01) | |

(52) U.S. Cl.
CPC .......... *B23K 26/0876* (2013.01); *B23K 26/10* (2013.01); *B23K 26/123* (2013.01); *B23K 26/1464* (2013.01); *B23K 26/36* (2013.01); *B23K 26/362* (2013.01); *B23K 26/364* (2015.10); *B23K 26/402* (2013.01); *C04B 41/0036* (2013.01); *C04B 41/5346* (2013.01); *C04B 41/91* (2013.01); *H01L 21/687* (2013.01); *H01L 21/68735* (2013.01); *B23K 2103/52* (2018.08)

(56) References Cited

U.S. PATENT DOCUMENTS

| | | |
|---|---|---|
| 2016/0276203 A1 | 9/2016 | Gratrix |
| 2016/0354864 A1 | 12/2016 | Hammer et al. |
| 2017/0072511 A1* | 3/2017 | DiGiovanni .......... B24D 18/00 |
| 2018/0104767 A1 | 4/2018 | Peng et al. |

FOREIGN PATENT DOCUMENTS

| | | |
|---|---|---|
| JP | 2012119378 A | 6/2012 |
| JP | 2014504458 A | 2/2014 |
| WO | 2009142710 A1 | 11/2009 |
| WO | 2012088004 A2 | 6/2012 |
| WO | 2016009103 A2 | 1/2016 |

OTHER PUBLICATIONS

Japanese Office Action issued in JP2019559332 dated Feb. 1, 2022 and Machine Translation.
Cunha et al., Ultrafast laser surface texturing of titanium alloys, Laser Surface Modification of Biomaterials, 2016 (Year: 2016).
Lawing et al., Advances in CMP pad conditioning, Semicon West, Jul. 2015 (Year: 2015).

* cited by examiner

INERT GAS-ASSISTED LASER MACHINING OF CERAMIC-CONTAINING ARTICLES

CROSS-REFERENCE TO RELATED APPLICATION(S)

This patent document claims the benefit of U.S. Provisional Application Ser. Nos. 62/500,482 and 62/500,491, each filed on May 2, 2017. Where permitted by law, the entire contents of each of these commonly owned patent applications are expressly incorporated by reference herein.

STATEMENT REGARDING FEDERALLY SPONSORED RESEARCH

None.

TECHNICAL FIELD

In one aspect, the present invention relates to machining techniques for use on ceramic-containing materials, including composites and glasses. The present invention particularly relates to laser machining techniques.

In another aspect, the present invention relates to machining methods for imparting a controlled roughness to an otherwise flat, smooth surface, particularly in articles or components for handling semiconductor wafers (e.g., silicon) wafers for processing, which could be, but is not limited to, lithography.

BACKGROUND ART

As Moore's Law pushes semiconductor feature sizes smaller and smaller, the need for highly precise wafer handling components (vacuum chucks, electrostatic chucks, wafer arms, end effectors, etc.) grows. Desired features for wafer handling components include high mechanical stability (high stiffness and low density), high thermal stability (high thermal conductivity and low coefficient of thermal expansion), low metallic contamination, machinability to high tolerance, low wear (to maintain precision), low friction (to prevent wafer sticking), and the ability to be fabricated to sizes of up to 450 mm. Furthermore, these chucks should have low friction with respect to the semiconductor wafers that they support, and, critically, must be free of particle contamination on the support surfaces.

These needs have pushed the manufacturing of wafer handling components to precision materials (e.g., SiC-based ceramics) and precision finishes, i.e., wafer contact surfaces with extreme flatness and low roughness.

However, it is well known in the technical literature that when two very flat and smooth surfaces are contacted, they will stick together (a phenomenon typically referred to as "optical contacting" or "contact bonding" or "stiction").

When stickiness is present between a wafer and a wafer support surface, it is difficult to quickly chuck and de-chuck a wafer, and it is difficult to hold a wafer in a precision fashion.

The Applicant manufactures several ceramic composites (i.e. Si/SiC, SiC/Diamond, etc.) that meet the mechanical and thermal stability requirements. Many of these ceramic composites are based on, or formed by, a reaction bonding process involving infiltration of molten silicon metal or silicon alloy into a porous mass containing an inert (or rendered inert) ceramic reinforcement. An example is infiltrating molten Si into a porous mass featuring SiC to form "reaction bonded silicon carbide" (or "RBSC" or "Si/SiC").

In order to reduce the friction between the chuck and the wafer, a pattern of pins is machined into the top surface of the chuck. By virtue of machining these pins, the overall contact area with the wafer—and thus the friction—is greatly reduced. A further benefit of low contact area is reduced wafer contamination.

Currently available methods to machine these pin patterns, such as Electric Discharge Machining (EDM), struggle to meet the demand for smaller and more precisely controlled pins. EDM preferentially machines the metallic component of these composites, leading to sub-surface damage (i.e. cracks and voids) and particle formation. Moreover, EDM leaves a surface oxide layer (also known as "re-cast") that can lead to particle contamination in wafer handling operations. Still further, EDM suffers from poor dimensional control. See, for example, the scanning electron microscope photograph of FIG. 14, which shows a pin in a wafer chuck machined by EDM. Of particular interest in this photograph are the loss of circularity 11 (e.g., a rough perimeter around the pin), crack initiation 13, and void formation 15.

EDM also requires that the material being machined be electrically conductive.

Laser machining provides a potential alternative to EDM. The laser can cut through all phases in a multi-phase material, allowing uniform geometries with very minimal sub-surface damage. However, conventional laser machining can locally heat the material, which can cause surface modifications and oxide formation. Such surface modifications and oxide formation are highly undesirable due to an increased propensity for particle contamination.

Another machining technique involves the use of a laser beam, most notably a laser machining technique based on "cold ablation". Cold-ablation is a relatively new laser machining technique that uses short, high energy laser pulses to quickly ablate the material while minimizing the local heating experienced by the material (part being machined). Cold-ablation does not completely avoid local heating, however, and some oxide formation can occur.

The instant invention addresses these problems, and provides a solution.

DISCLOSURE OF THE INVENTION

Next generation ceramic-containing wafer chuck machining processes require:
High dimensional accuracy
Low sub-surface damage
Low local heating
Low surface modification
Low oxide formation
Low particle contamination.

EDM struggles to meet ever-tightening requirements, as described above. Conventional laser machining meets dimensional requirements but allows for undesirable surface modification. Cold ablation laser machining does not completely solve the surface modification problem.

In accordance with one aspect of the present invention, what is provided is an assist to the cold ablation laser machining technique, the assist being provided by an inert gas atmosphere.

In another aspect of the invention, and per the embodiments of the instant invention, in a device for handling semiconductor wafers, a portion of the highly flat surface that supports the wafer ("the wafer support surface"), is removed by machining, thereby reducing the area of contact between the support surface and the wafer. This action reduces the friction between these two, and thus the propensity for "optical sticking". The machining may take the form of a groove or channel, or a plurality of such grooves or channels, or a plurality of holes such as "blind" holes. In this way, a "texture" or controlled roughness is imparted to the support surface. Embodiments of the present invention may use a laser for this texturing, which laser may be a thermal laser, a cold ablation laser, or a laser (thermal or cold ablation) modified with an inert "cover" gas to reduce oxidation of non-oxide materials.

BRIEF DESCRIPTION OF THE FIGURES

FIG. 9B shows the pattern of a plurality of pins machined into the surface.

MODES FOR CARRYING OUT THE INVENTION

Figure 1A:
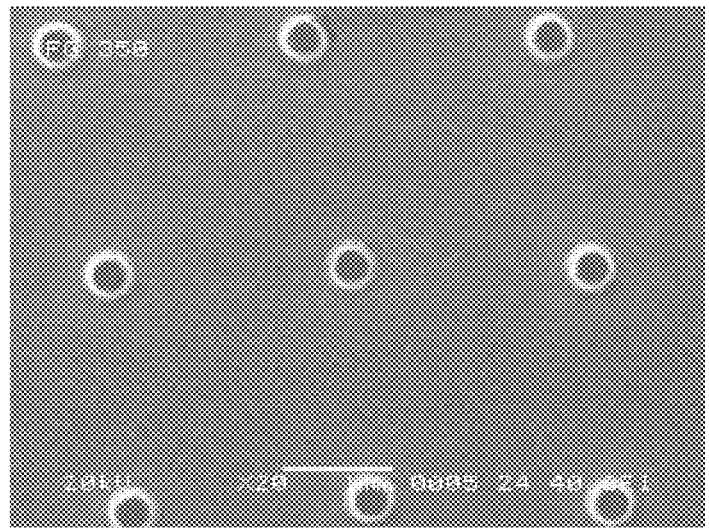
FIGS. 1A and 1B are SEM photographs at different magnifications of pins in a Si/SiC wafer chuck that were laser machined according to the instant invention.

Next generation wafer handling components (e.g., wafer chucks) require:
High mechanical stability (high stiffness, low density)
High thermal stability (high thermal conductivity, low CTE)
High wear resistance
Low sticking
Precision flatness and low roughness Applicant supplies SiC-based ceramic components, typically with surface pins) for the application—see, for example, FIGS. 13A and 13B. An issue is that as flatness and roughness improve, unwanted stickiness becomes a problem due to the optical contact bonding effect. When stickiness is present, it is difficult to quickly chuck and de-chuck a wafer, and it is difficult to hold a wafer in a precision fashion.

Mechanical grinding or Electrical Discharge Machining (EDM) can potentially be used to impart a texture to the optically flat surface, with certain limitations. As will be discussed in more detail below, both mechanical grinding and EDM are limited to machining feature sizes of about 1000 microns, and with precision (or reproducibility) of about 200 microns. Where the semiconductor wafer support surface is a collection of "pins" all having a defined and very precise elevation, mechanical grinding will be insufficiently precise. Similarly, EDM is of questionable precision, as the size (diameter) of a support pin may be on the order of 200 microns. EDM machining of such a pin may obliterate the entire pin top surface instead of only a portion of the surface.

EDM also requires that the material being machined be electrically conductive. Where the material being machined is a metal-ceramic composite, EDM preferentially machines the metallic component of these composites, leading to sub-surface damage (i.e. cracks and voids) and particle formation. Moreover, EDM leaves a surface oxide layer (also known as "re-cast") that can lead to particle contamination in wafer handling operations.

One attractive solution is a laser textured, or laser machined, surface, which prevents stickiness by inducing a pseudo-roughness to the surface. According to this technique, the surface of the wafer-handling article that is intended to support the semiconductor wafer is first configured, e.g., machined, polished and/or lapped to the desired flatness, which may be optically flat, that is, "flat" to within a tolerance measured on the nanometer scale. Typically, such a precise degree of flatness also has associated with it a similar degree of smoothness. Some of the wafer support surface ("a second portion") is then further processed, e.g., textured or machined, thereby removing some material of that portion of the support surface. This leaves a first portion of the wafer support surface untextured, thereby leaving it at its existing level of flatness and smoothness. The second portion of the surface thus is relieved or recessed (e.g., at a lower elevation) relative to the elevation of the first portion. So, one portion of the support surface is left intact, and another portion is machined or etched away. This is what is meant by "pseudo roughness". This procedure has the effect of further reducing the contact area between the support surface and the article being supported (e.g., semiconductor wafer), which reduces friction and particularly the optical sticking phenomenon.

This texturing or machining of the second portion of the support surface can be performed by a thermal laser. The laser beam can be manipulated to provide the relief or recesses ("texturing") in a random, or in an organized way.

The laser beam can be moved relative to the support surface to remove at least a surface layer of material, thereby creating a groove or channel in the material of the support surface. The texturing may be in the form of a plurality of channels, some of which may be parallel to one another, for example. Two sets of such parallel channels may be angled with respect to one another to create a cross-hatch pattern. Alternatively, the laser beam can be held in a fixed position relative to the support surface to create a hole, such as a blind hole. The depth of the groove, channel or hole should be at least 1 micron.

There is a "characteristic width" associated with the laser machining or texturing operation. One aspect of the characteristic width is the width of the groove, channel or hole that is produced by the laser beam. If a plurality of grooves, channels, or holes are produced, another aspect of the characteristic width is the spacing between adjacent holes, or parallel grooves or channels. In other words, this aspect measures the width of a region of material (e.g., unmachined material) between adjacent textured surfaces (grooves, channels or holes). A regular, periodic, repeating form of such spacing is sometimes referred to as "pitch". Both aspects of the characteristic width of the laser machining operation are finer (e.g., smaller width) than can be achieved by mechanical machining such as grinding, or by EDM, as will be discussed in greater detail in Example 3 below.

Exemplary Laser Processing Conditions (Thermal Laser)
1.064 micron Nd:YAG
100 Watt max average power
50-300 microsecond pulse rate
Direct beam
300 mm×300 mm stage
1 micron repeat stage precision Exemplary Modified Cold Ablation Laser Machining Technique Laser machining provides a potential alternative to EDM. The laser can cut through all phases in a multi-phase material, allowing uniform geometries with very minimal sub-surface damage. However, conventional laser machining can locally heat the material, which can cause surface modifications and oxide formation, particularly where the material includes a metal and/or non-oxide ceramic. Such surface modifications and oxide formation are highly undesirable due to an increased propensity for particle contamination.

"Cold-ablation" is a relatively new laser machining technique that uses short, high energy laser pulses to quickly ablate the material while minimizing the local heating experienced by the material (part being machined). Cold-ablation does not completely avoid local heating, however, and some oxide formation can occur if the machining is performed in air.

The Applicant has developed a laser machining technique based on cold-ablation with an inert assist gas, which minimizes the surface modifications and mitigates the oxide formation. In particular, Applicant has modified the cold-ablation laser machining equipment to include a gas nozzle that envelopes the local area being machined in an inert atmosphere (e.g., Argon or other such as Helium, Neon, Krypton, Xenon). The atmosphere, being inert, prevents oxide formation. The overall result is a machining technique that can be used on ceramic-containing materials such as monolithic ceramics and composites based on ceramic and/or metal. The instant machining technique can be used to machine a pin pattern into a supporting platform or device such as a wafer chuck, achieving high dimensional control (tight tolerances) and with little to no surface modification (including oxide formation).

Figure 2:
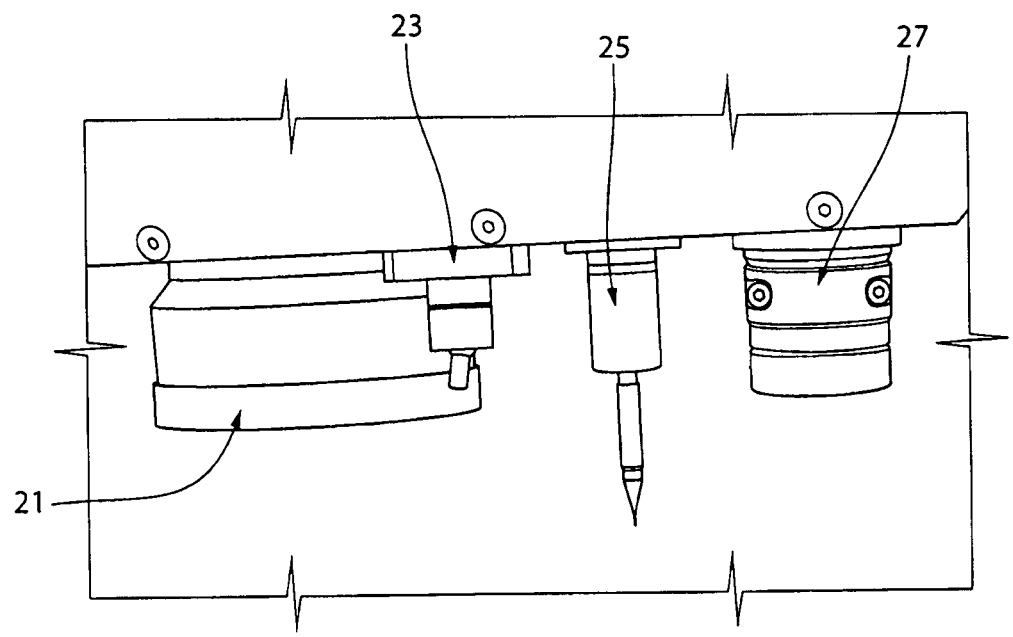
FIG. 2 is a side view drawing of an inert gas-assisted cold ablation laser machining apparatus.

What is shown in FIG. 2 is a side-view drawing of the modified cold ablation laser apparatus. In particular, the set-up shows: a laser objective lens 21 for short duration high energy laser pulses, a nozzle 23 for directing inert gas onto the surface to be machined, a mechanical measurement probe 25, and an optical measurement camera 27. Not shown is a movable galvanometer mirror to direct and focus the laser light onto and ablate the material to be machined. The modified pressurized gas nozzle achieves two goals: (i) the flow of gas removes machining debris from the immediate area, and (ii) the flow of gas envelops the machining area in an inert argon atmosphere, preventing oxidation.

Acceptable ranges for the modified cold ablation laser processing conditions are:
Wavelengths used between 1080 nm and 150 nm
Pulse widths between 300 ns and 1 fs
Repetition rate between 100000 Hz and 1 Hz
Scan speed up to 1000 mm/s
Power up to 120 W
Argon as assist (cover) gas The present modified cold ablation laser machining methods (featuring an inert gas "assist") will work with most metals and ceramics, including composites, and including metal-ceramic composites. Other materials that can be machined with this technique and are used for semiconductor wafer handling are AlN, sintered SiC, CVD SiC, $Al_2O_3$, glass, and glass ceramics. It is especially important when the metal in question has a tendency to quickly form an oxide when heated (by, for example, laser exposure) in air (i.e. Si, Ti, Al, etc.). Furthermore, it is important when the ceramic phase thermally decomposes under laser exposure into one of the aforementioned metals (i.e. SiC, TiC, AlN, etc.).

Silicon carbide (SiC) has desirable properties for use as a wafer chuck: low density, low thermal expansion coefficient, and high thermal conductivity, to name three.

Silicon carbide-based bodies can be made to near net shape by reactive infiltration techniques, and such has been done for decades. In general, such a reactive infiltration process entails contacting molten silicon (Si) with a porous mass containing silicon carbide plus carbon in a vacuum or an inert atmosphere environment. A wetting condition is created, with the result that the molten silicon is pulled by capillary action into the mass, where it reacts with the carbon to form additional silicon carbide. This in-situ silicon carbide typically is interconnected. A dense body usually is desired, so the process typically occurs in the presence of excess silicon. The resulting composite body thus contains primarily silicon carbide (for example, 40-80 volume percent), but also some unreacted silicon (which also is interconnected), and may be referred to in shorthand notation as Si/SiC. The process used to produce such composite bodies is interchangeably referred to as "reaction forming", "reaction bonding", "reactive infiltration" or "self bonding".

For added flexibility, one or more materials other than SiC can be substituted for some or all of the SiC in the porous mass. For example, replacing some of this SiC with diamond particulate can result in a Si/diamond/SiC composite. The volume fraction of diamond can be engineered to range from 10 percent to 70 percent. Further, the silicon metal may be alloyed, or the porous mass may contain a metal other than silicon, to yield a reaction formed composite containing the alloying element. For example, the silicon constituent in a Si/SiC composite may be modified with titanium to yield a SiC-containing composite body featuring both silicon and titanium, which may be denoted as "TiSi/SiC". Successful infiltrations to form such titanium-containing reaction-formed SiC composites have been carried out using infiltrant metals containing 15 wt % and 40 wt % titanium, respectively, balance silicon. The instant embodiments of the invention are used on all of these materials.

Characterization of a Surface Machined by Various Techniques

The following describes how to characterize or differentiate a machined surface prepared by traditional grinding/lapping/polishing from one machined by EDM, and from one machined with a laser beam. Note: a metal-ceramic composite material, namely, Si/SiC was used for this characterization.

The surfaces resulting from the different operations can be distinguished by the surface roughness. In grinding operations (i.e. surface grinding, spin grinding, jig grinding or lapping) with course abrasive diamond tool, will leave scratches in the surface (parallel scratches in surface grinding, concentric in spin grinding, randomized for jig grinding and lapping). In grinding operations with randomized motion and fine diamond abrasive (i.e. jig grinding with fine tools or lapping) the surface becomes polished. The polished surface will have will have flat tops, all at the same height, of the ceramic grains with the metal between the ceramic slightly relieved.

In contrast, a laser machined surface will have a controlled roughness. The laser machining removes material in a series of circular areas that is scanned over the surface. The roughness is controlled by the degree of overlap of the circular areas. Within each circular exposure area, the ceramic grains will have some roughness and stand slightly proud of the inter-granular metal.

While grinding and laser machining have a small difference between the material removal rate of the ceramic and the metal, EDM operations almost exclusively machine the metal. Because of this, the EDM surface is very different with a melted/oxidized textures (a "recast layer"). An electrical discharge machined surface will have a random roughness. The metal is removed deeply between the ceramic grains. There will also be micro-cracks of removed metal that will extend deep below the surface. In some cases, these micro-cracks can through the feature and connect to cracks from the opposing surface several hundred microns away.

Table 1 quantifies the roughness discussed above. The table shows that laser machining of a finely ground (polished) Si/SiC composite material surface increases the roughness by about an order of magnitude at relatively low laser power, but roughly triples this roughness at higher power levels. Nevertheless, the roughness obtained through electrical discharge machining was still more than double the roughness produced by the 85 watt laser.

TABLE 1

| Surface | Measured roughness ($R_A$ in microns) |
| --- | --- |
| Ground | 0.098 |
| 85 W laser machined | 2.4 |
| 29 W laser machined | 0.89 |
| 15 W laser machined | 0.75 |
| EDM | 5.1 |

Another difference among grinding, EDM and laser machining is in terms of potential modifications to the chemistry and crystallinity of the machined surface. The predominant feature of a thermal laser machined surface is a melted or heat-affected zone. In contrast, when a Si/SiC material is laser machined with an Ar-assisted cold ablation laser, this instant process provides:

For more precise control of machined features
    Much less sub-surface damage
    Smoother surface finishes
    Much less roughness on feature edges
    No evidence of crack or void formation
    Avoidance of oxidation and reduced propensity for particle formation.

By "avoidance of oxidation", the Applicant means that no oxidation was observed visually, in optical microscopes, or even in the SEM. This does not preclude the possibility, however, of atomic scale oxidation being present on metal or non-oxide ceramic surfaces, for example one, several, perhaps up to half a dozen atomic layers of oxide present on the machined surface. This result is in distinct contrast with thermal laser and EDM, where there is an observed layer of oxidation.

The invention will now be further described with reference to the following examples.

Example 1

Laser Machining Pins in a Si/SiC Wafer Chuck

Figure 1B:
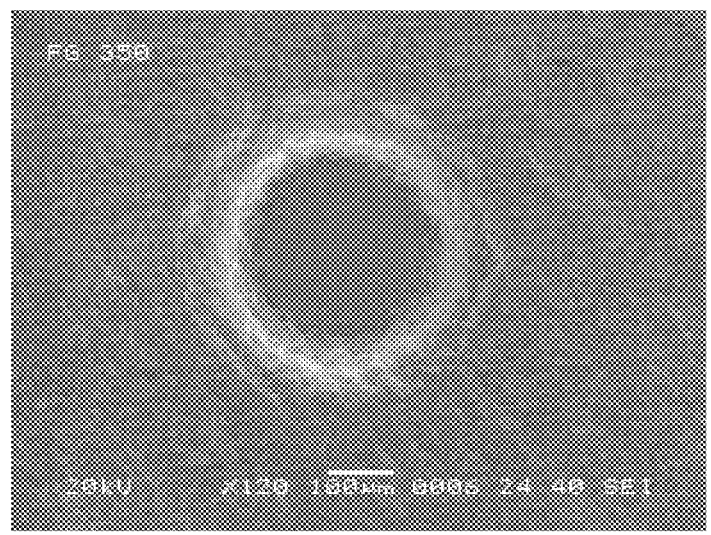

Refer now to FIGS. 1A and 1B, which are SEM photographs at different magnifications of pins in a Si/SiC wafer chuck that were laser machined according to the instant invention. The laser machining was performed by means of a cold ablation laser apparatus modified or supplemented with a means (e.g., a nozzle) to direct an inert gas (here, argon gas) onto the surface of the Si/SiC material to be machined in the vicinity, zone or region of the laser beam.

In addition to little-to-no surface modification of the machined surface of the Si/SiC material, the Ar-assisted cold-ablation laser machining provides:

For more precise control of machined features
    Much less sub-surface damage
    Smoother surface finishes
    Much less roughness on feature edges
    No evidence of crack or void formation
    Avoidance of oxidation and reduced propensity for particle formation.

By "avoidance of oxidation", the Applicant means that no oxidation was observed visually, in optical microscopes, or even in the SEM. This does not preclude the possibility, however, of atomic scale oxidation being present on metal or non-oxide ceramic surfaces, for example one, several, perhaps up to half a dozen atomic layers of oxide present on the machined surface. This result is in distinct contrast with thermal laser and EDM, where there is an observed layer of oxidation.

Example 2

Comparison of Laser Drilled Holes in Si/SiC

This example shows the effect of adding an inert gas "assist" to a cold ablation laser machining process.

Figure 3:
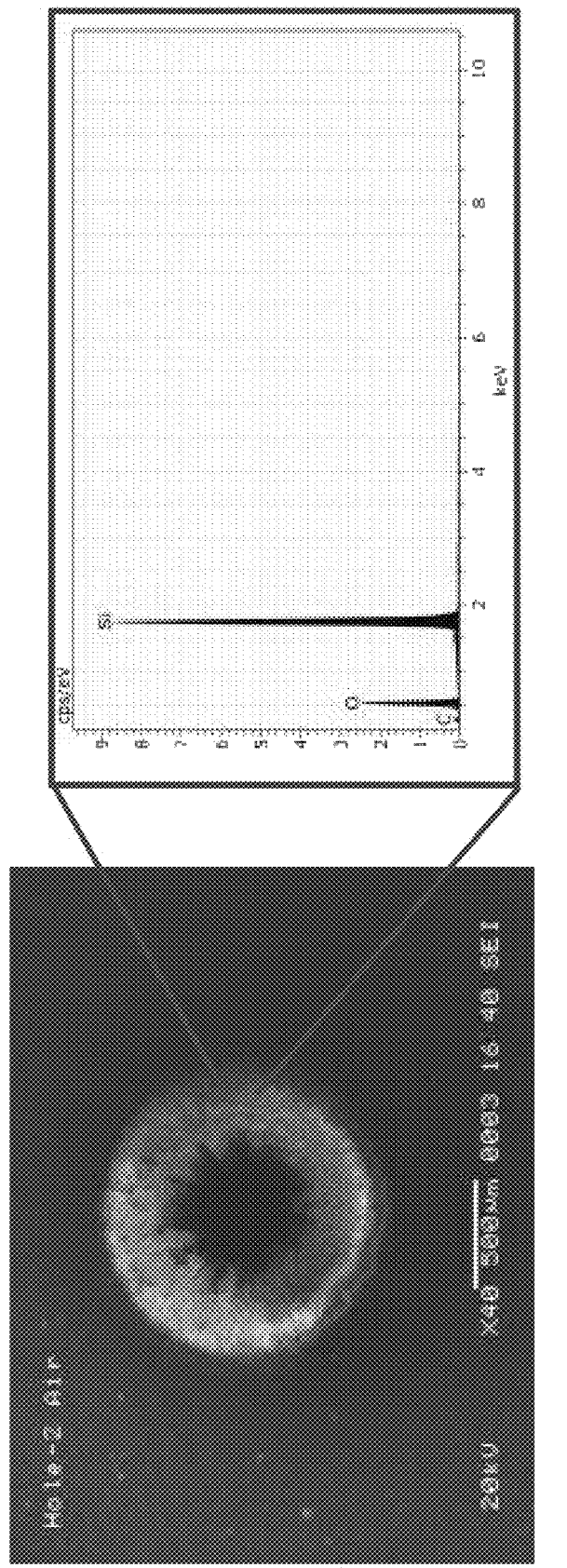
FIG. 3 shows a hole drilled in a Si/SiC composite material by means of a laser, the process being conducted in air.

Here, the process is in drilling a hole in a Si/SiC composite material formed by a reaction-forming process. FIG. 3 shows the process being conducted in air. The left side of the figure is a SEM photo of the hole. The right side of the figure shows the elemental analysis of the edge of the hole according to energy dispersive analysis by x-ray (EDAX).

Figure 4:
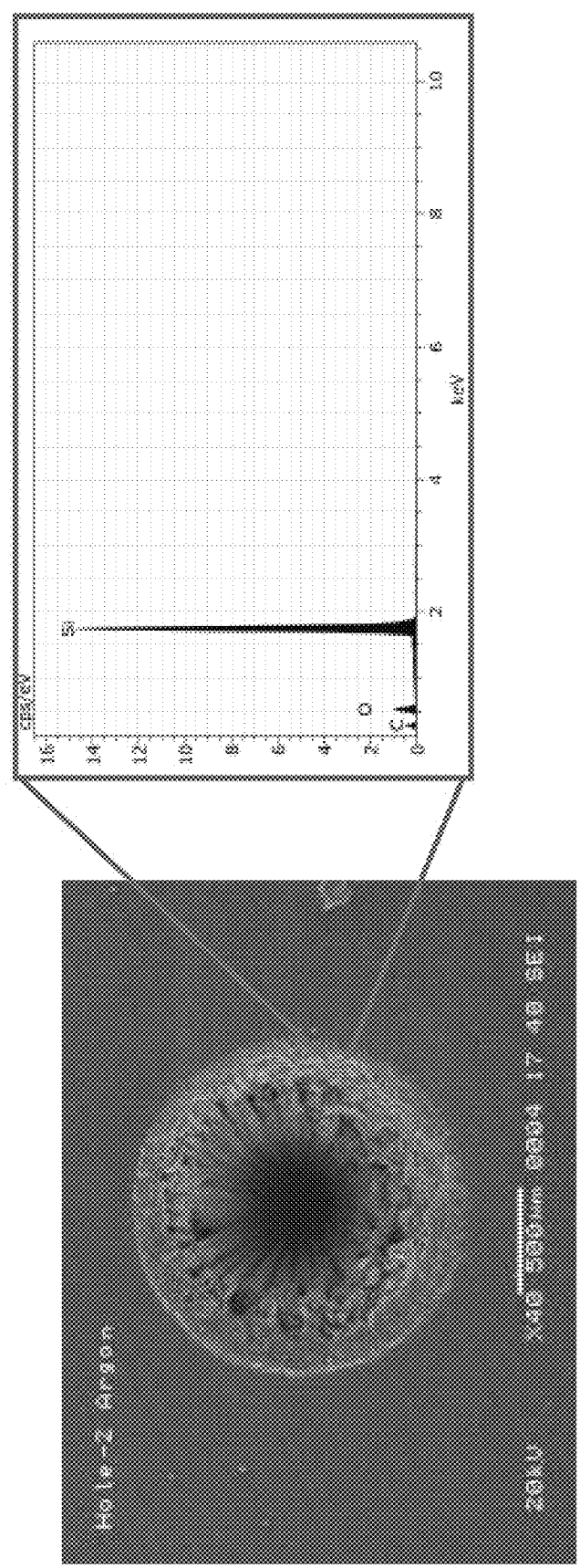
FIG. 4 shows a hole drilled in a Si/SiC composite material by means of a laser, the process being conducted in a flowing argon cover gas.

Similarly, FIG. 4 shows the process being conducted in flowing argon cover gas. The left side of the figure is a SEM photo of the hole. The right side of the figure shows the elemental analysis of the edge of the hole according to energy dispersive analysis by x-ray (EDAX). Comparing the ratio or relative sizes of the oxygen peak to the silicon peak in FIG. 3 versus FIG. 4, one can see that the oxygen peak is greatly reduced where the argon cover gas was used, indicating much less oxide formation during the laser drilling process. In fact, the amount of oxide formed using the argon cover gas was less than half as much as the amount formed when laser drilling was conducted in air. Here, the argon gas contained some oxygen and/or water vapor impurity; a purer source gas would have reduced the amount of oxide formed still further.

The formation of an oxide layer can cause a number of problems, particularly in the context of the fabrication of components for handling semiconductor wafers, such as wafer chucks. These problems include: reduced tolerance control, reduced surface hardness, potential particle contamination (e.g., from spalling of oxide), non-uniform surface properties, and stress and strain (e.g., warping) problems caused by joined materials having different thermal expansion coefficients (bi-metallic strip effect).

Example 3

Comparison of Pocket Cuts in Si/SiC

This example compares the quality of a "pocket cut" among the modified cold ablation laser machining technique of the instant invention, a prior art cold ablation laser machining process, and a prior art electrical discharge machining process. In each instance, the pocket cut was prepared on a sample of Si/SiC composite material produced by reaction bonding. A pocket cut may be prepared by providing an orthogonal prism of material such as a cube, and proceeding to shave off material on one side to a desired depth but leaving a region near the top surface intact, and then doing the same on an adjacent side surface, again leaving a region near the top surface undisturbed.

Figures 5A, 5B, 5C:
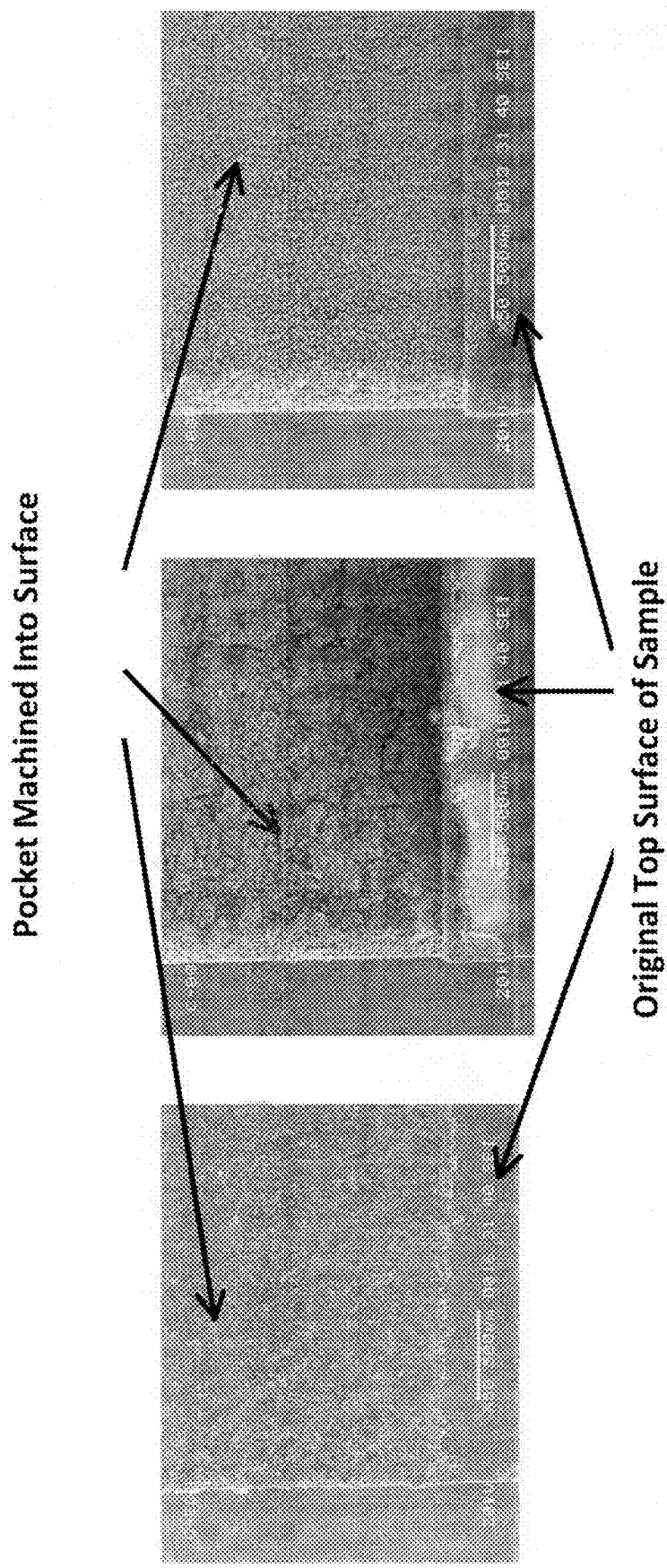
FIGS. 5A, 5B and 5C are SEM photographs at the same magnification of pocket cuts made into samples of Si/SiC composite material by EDM, the prior art cold ablation laser in air, and the instant cold ablation laser machining under protective argon gas flow, respectively.

FIGS. 5A, 5B and 5C are SEM photographs at the same magnification of pocket cuts made into the Si/SiC samples by EDM, the prior art cold ablation laser in air, and the instant cold ablation laser machining under protective argon gas flow. The samples are oriented each the same way, showing a frontal view of one of the machined side surfaces, and side views of the top surface and the other side surface.

The prior art EDM pocket cut of FIG. 5A exhibits a non-uniform edge, reflecting sub-surface damage as particles in the Si/SiC composite pop out under the action of the electric discharge. The cut surface also shows an oxide/recast layer. The (prior art) cold ablation laser pocket cut of FIG. 5B exhibits a more uniform edge (a straight cut), reflecting the laser cutting through all phases of the Si/SiC composite. However, oxide build-up at the cut surfaces is seen. The modified argon gas, cold ablation laser pocket cut of the instant invention of FIG. 5C also exhibits a uniform edge (a straight cut), but also shows that the cut surfaces are "clean", with no formed oxide seen.

Example 4

Laser Machining of Si-Containing Composites of Different Compositions

Figure 6A:
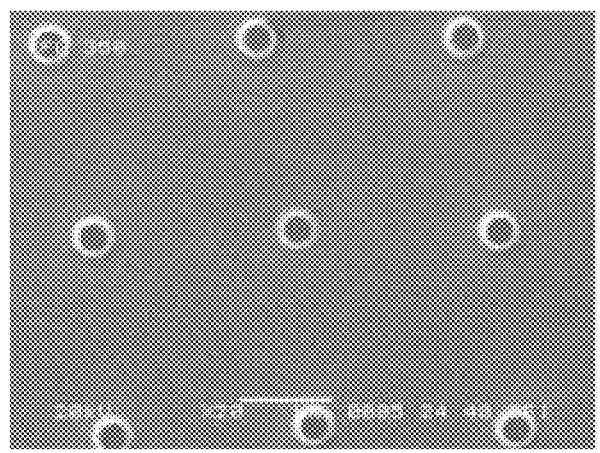
FIGS. 6A-6C are SEM photographs showing pins that were laser machined according to the instant invention into a surface of a Si/SiC composite material, a TiSi/SiC composite, and a Si/Diamond composite material.
Figure 6B:
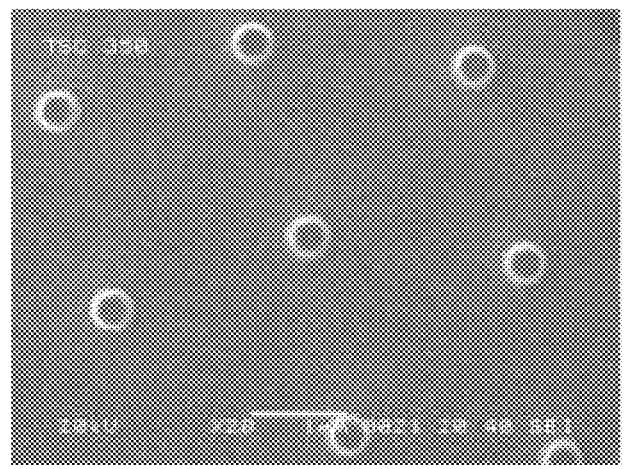
Figure 6C:
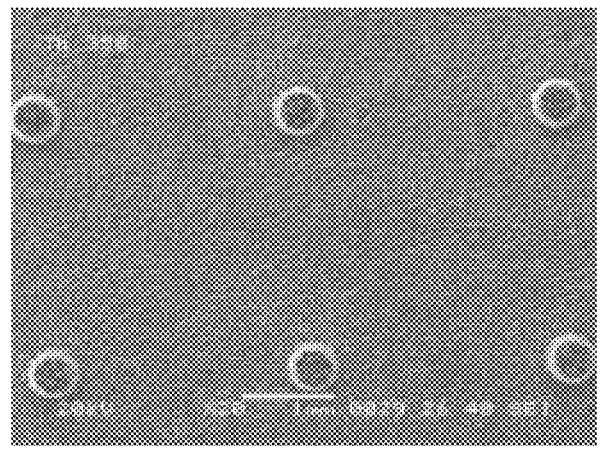

FIGS. 6A-6C are SEM photographs showing pins that were laser machined according to the instant invention into a surface of a Si/SiC composite material, a TiSi/SiC composite material, and a Si/Diamond composite material. Thus, this example shows the versatility of the instant techniques. Note that the diamond-containing composite material cannot be machined using mechanical techniques (e.g., grinding) because of the hardness of the diamond particles.

Example 5

Dimensional Precision of the Instant Techniques

Figure 7A:
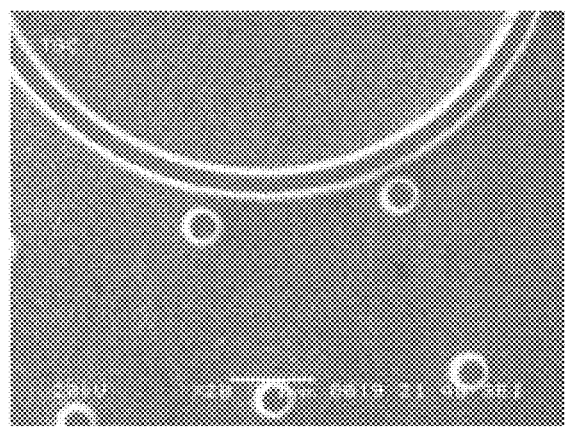
FIGS. 7A-7C are SEM photographs further illustrating the capabilities of the instant embodiments of the invention.
Figure 7B:
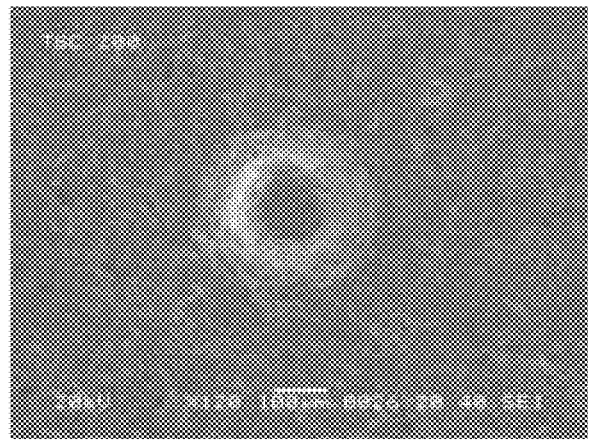
Figure 7C:
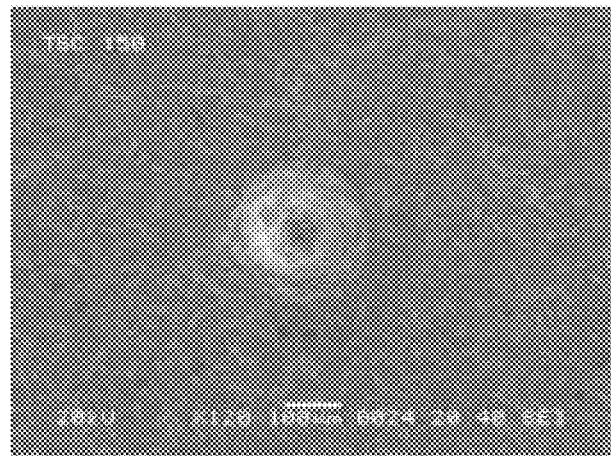

FIGS. 7A-7C are SEM photographs further illustrating the capabilities of the instant embodiments of the invention. FIG. 7A shows different geometric features that were laser machined and being spaced apart from one another by less than 200 microns. FIG. 7B shows a laser machined pin in a wafer chuck, the pin having a base measuring about 200 microns across. FIG. 7C shows a pin having a base that is about 150 microns across, the pin also being laser machined according to embodiments of the instant invention.

EDM and thermal laser have an accuracy issue due to "over-burn". Essentially, there is a heat affected zone/melted zone ahead of the cut. The modified cold laser ablation process of the instant invention has a crisp cut because there is not a thermal impact. EDM can machine features with sizes down to about 200 microns in diameter, and hold tolerances of ±(plus or minus) 12 microns in these materials. Mechanical machining such as by grinding can machine features down to about 1000 microns in size, and hold tolerances of ±200 microns. Net-shape molding similarly has a tolerance capability of ±200 microns. The laser machining can machine features that are 500 microns, 200, 100, even down to 50 microns in size, and hold tolerances of ±0.1 microns in these materials. Feature sizes even smaller than 50 microns might be possible.

In the context of the present invention embodiments, the smallest feature size that can be machined can be expressed in terms of the narrowest width of the passage, channel, or groove that can be machined between two features, or the smallest diameter hole that can be drilled. For example, in FIG. 7A, a pin and a groove for a vacuum seal are shown to be about 200 microns apart. Since ceramic material was removed (machined) to create these two features, and the space (depressed area) between them, the instant machining technique is shown to yield this narrow spacing. The machined area has a lower elevation (is recessed) relative to the elevation of the adjacent two features. Where a hole is concerned, the machined surface defines the hole. For a "blind" hole, the bottom of the hole is at a lower elevation than the elevation of material outside and adjacent the hole.

Greater dimensional precision allows for more flexible pin geometries and patterning. Because the material can be removed with little surface modification, smaller features can be machined. Inert gas-assisted cold ablation laser machining has greater control over the profile of the pins and spacing to other features. This will also benefit downstream processes.

Example 6

Laser Machining of Non-Conductive Materials

This example demonstrates the use of the modified cold ablation laser machining technique of the invention to machine materials that are insufficiently electrically conductive to be machined by electrical discharge machining (EDM).

Figure 8A:
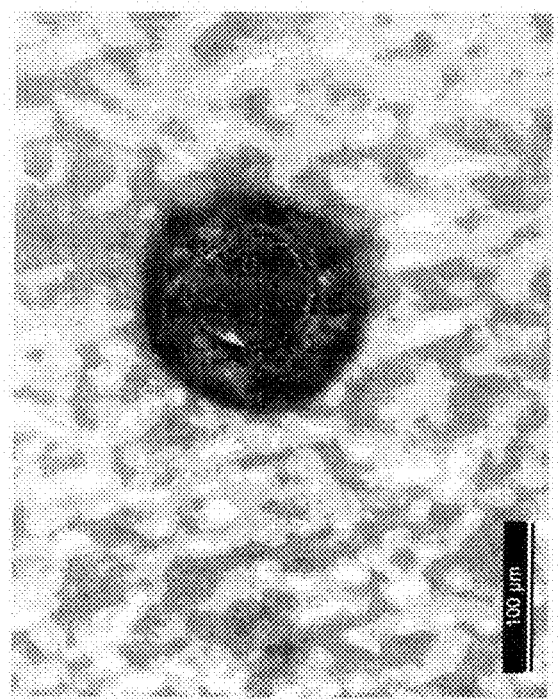
FIG. 8A (inset) is a photomicrograph of one pin laser machined in CVD SiC.
Figure 8B:
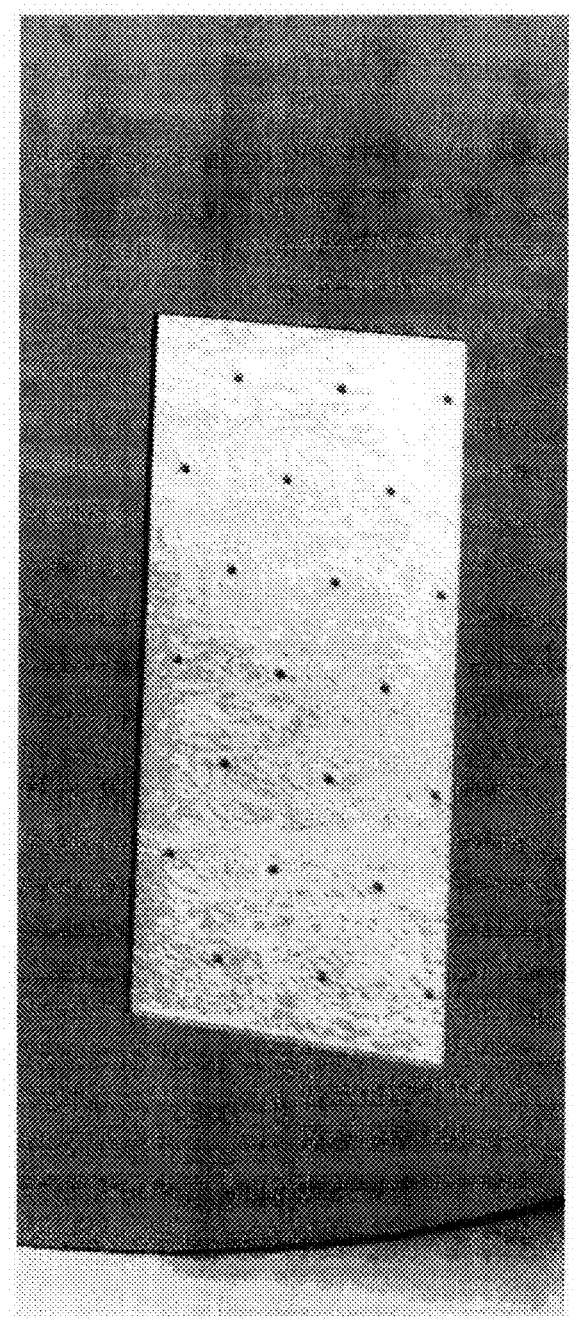
FIG. 8B is a photograph of this CVD SiC showing the pattern of a plurality of pins machined into the surface.

1. CVD SiC:

FIG. 8A (inset) is a photomicrograph of a pin machined in silicon carbide (SiC) produced by a chemical vapor deposition (CVD) process. The machining was according to the instant invention, e.g., cold ablation laser modified with protective inert gas. FIG. 8B is a photograph of the laser machined surface of this CVD SiC showing the pattern of a plurality of pins machined into the surface.

CVD SiC cannot be machined by EDM, as its electrical resistivity is too high—on the order of 10E6 (one million) ohm-cm.

Figure 9B:
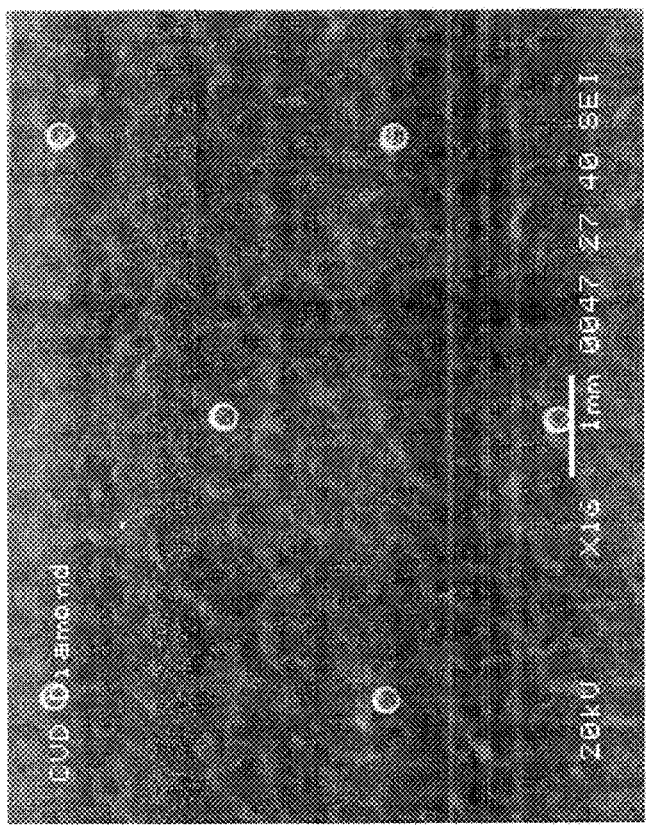
FIGS. 9A and 9B are high magnification and low magnification SEM photos, respectively, of a pin machined in a CVD diamond body.
Figure 9A:
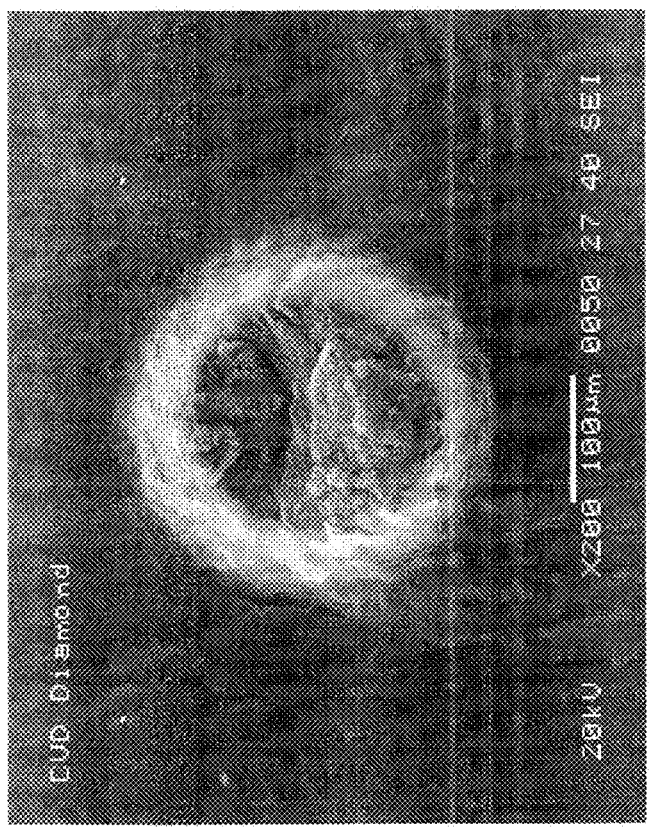

2. CVD Diamond:

FIG. 9A is a photomicrograph of a pin machined in diamond produced by a chemical vapor deposition process. The machining was according to the instant invention, e.g., cold ablation laser modified with protective inert gas. FIG. 9B is a photograph of the laser machined surface of this CVD diamond showing the pattern of a plurality of pins machined into the surface.

CVD diamond cannot be machined by EDM, as its electrical resistivity is too high—on the order of $1 \times 10^{16}$ (10E16) ohm-cm.

Inert gas-assisted cold ablation laser machining can meet the requirements for machining of the next generation of semiconductor wafer handling equipment.

Among the benefits, both direct and indirect, are:

Because laser machining causes less surface modification and little to no sub-surface damage, and has greater dimensional control, pin pattern machining can be optimized to greatly benefit downstream processes.

Not limited to electrically conductive materials.

Greater flexibility of feature design can be utilized (feature profile and footprint, surface texturing).

Easily scalable to 450 mm diameters and beyond.

Large machining centers are available, enabling many parts to be machined at once.

What is illustrated next are several examples relating to the laser texturing aspect of the invention.

Example 7

Laser Texturing a Wafer Handling Device

Figure 13A:
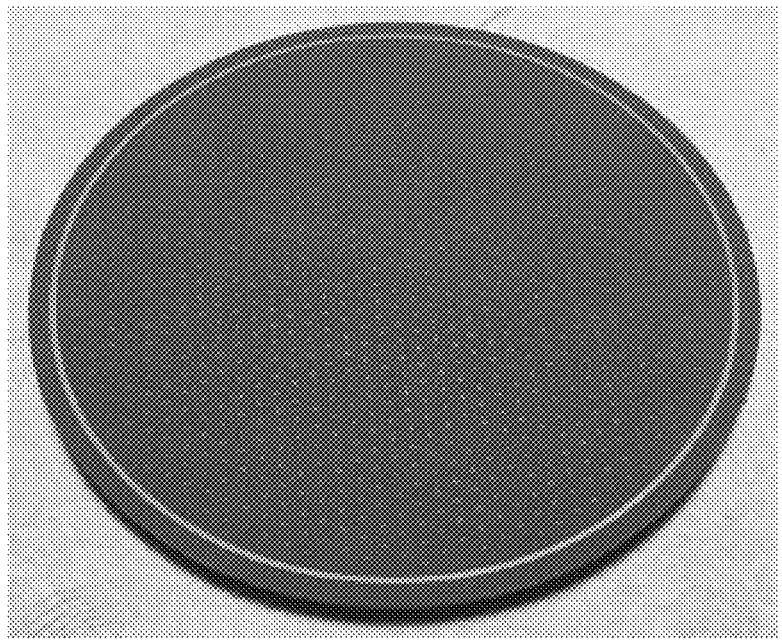
FIGS. 13A and 13B are photographs at two different magnifications of a Si/SiC wafer handling device to support a semiconductor wafer, the device featuring pins on the support surface.
Figure 13B:
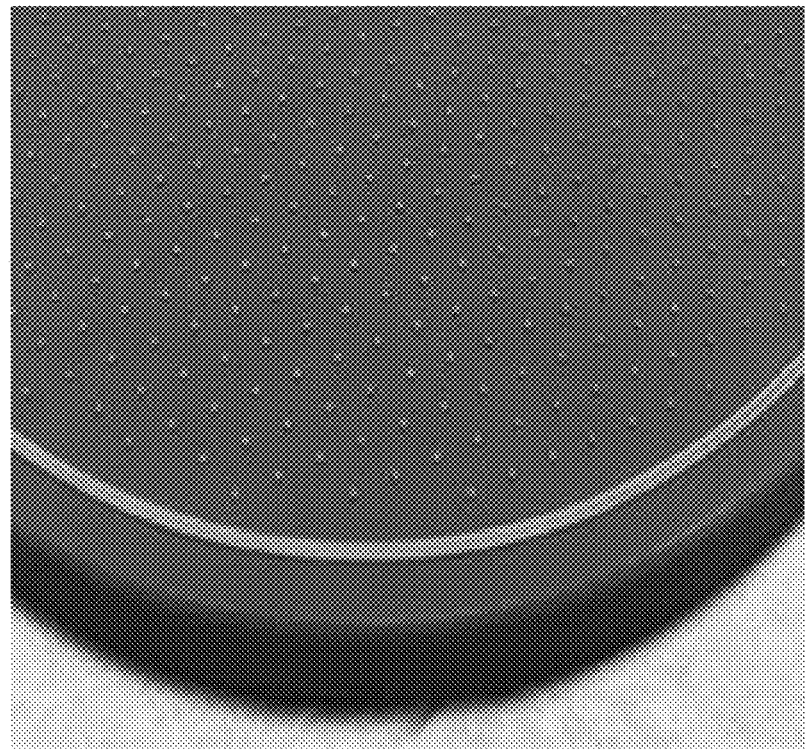
Figure 14:
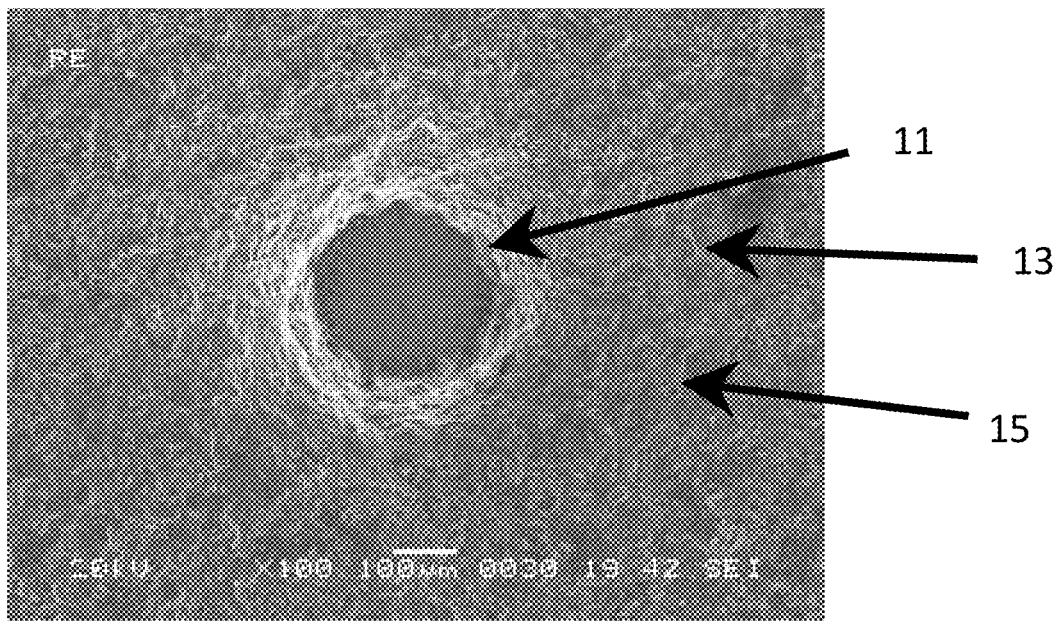
FIG. 14 is a scanning electron microscope (SEM) photograph highlighting the performance limitations of EDM. It is representative of the prior art.

A Si/SiC wafer handling device with surface pins (also known as "mesas" or "plateaus") to support a semiconductor wafer is provided, and is similar to those shown in FIGS. 13A and 13B. The pins are at a very uniform elevation, and greatly reduce the contact area between device and wafer. Nevertheless, the pin tops are very smooth, giving rise to the "optical sticking" phenomenon.

Laser texturing was employed to roughen (provide a pseudo roughness" to) the pin tops. Specifically, a thermal laser was used to machine or etch a cross-hatch pattern into at least one pin top of the wafer handling device.

Figure 10A:
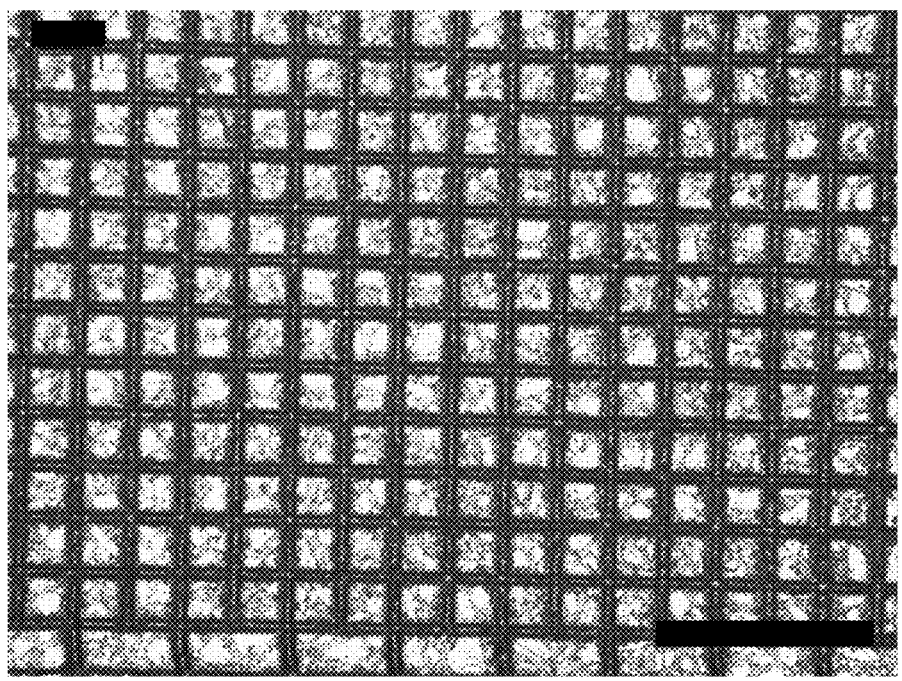
FIGS. 10A and 10B are photomicrographs taken at two different magnifications of a cross-hatched pattern of channels laser etched on the semiconductor wafer support surface of a Si/SiC body.
Figure 10B:
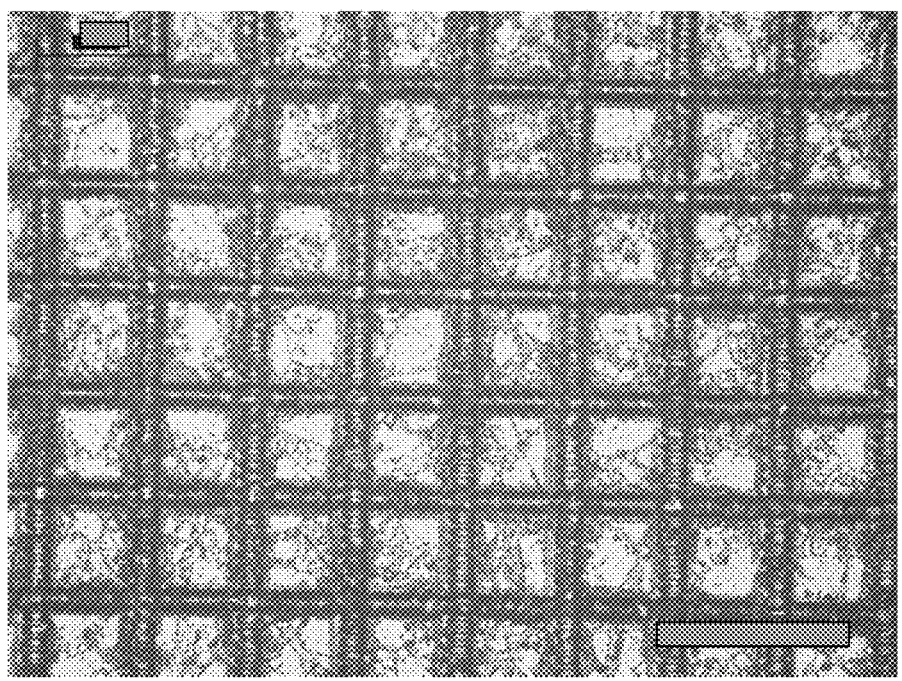

The texturing (cross-hatching) can be conducted with a wide range of laser parameters. For the present example, the Si/SiC was textured with the following laser parameters:

1.064 um Nd:YAG (thermal laser)
100 W max average power
50-300 um pulse rate
Direct beam
300 mm×300 mm stage
1 um repeat stage precision The results of this laser texturing are illustrated in the two photomicrographs of FIGS. 10A and 10B. The photos are of the same area on a pin top of the Si/SiC wafer handling device, just at different magnifications. A right-angled cross-hatch pattern is seen. The pattern corresponds to channels burned into the Si/SiC material, with each channel being about 3 microns deep and about 10 microns wide. The pitch (periodicity) of the channels is about 80 to 90 microns.

Example 8

This Example demonstrates laser texturing a wafer handling device using a cold ablation laser modified with an inert cover gas. The material being laser machined was the same as in Example 1, namely, a silicon/silicon carbide composite material made by reactive infiltration.

Figure 11A:
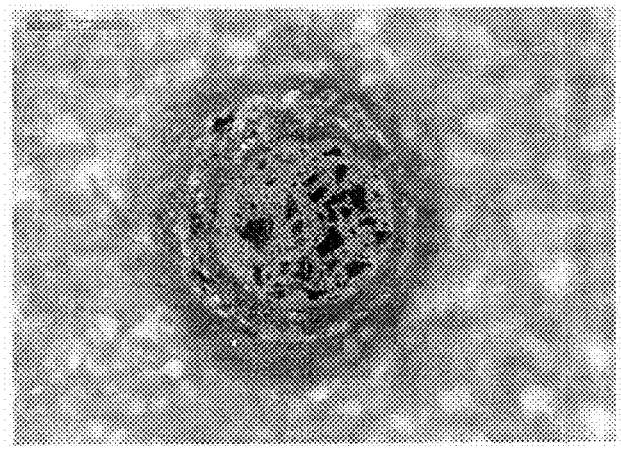
FIGS. 11A-11C are photomicrographs of an untextured wafer support pin, a wafer support pin textured with a cross-hatch pattern with 80 micron spacing, and a wafer support pin textured with a cross-hatch pattern with 50 micron spacing, respectively.
Figure 11B:
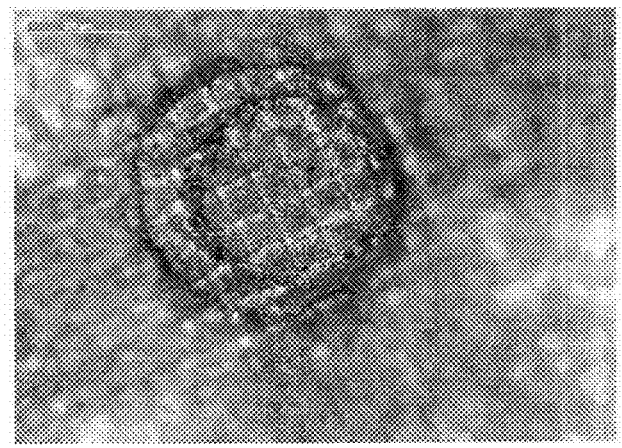
Figure 11C:
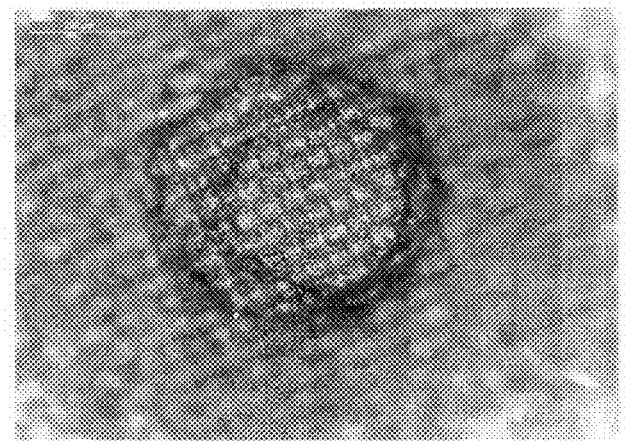
Figure 12A:
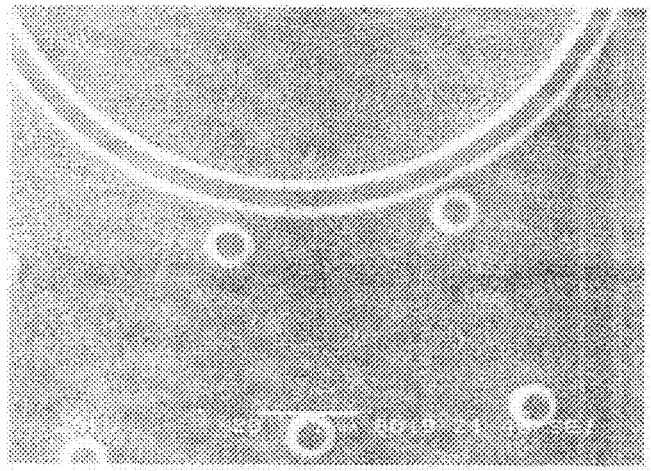
FIGS. 12A-12C are SEM photographs further illustrating the capabilities of the instant embodiments of the invention.
Figure 12B:
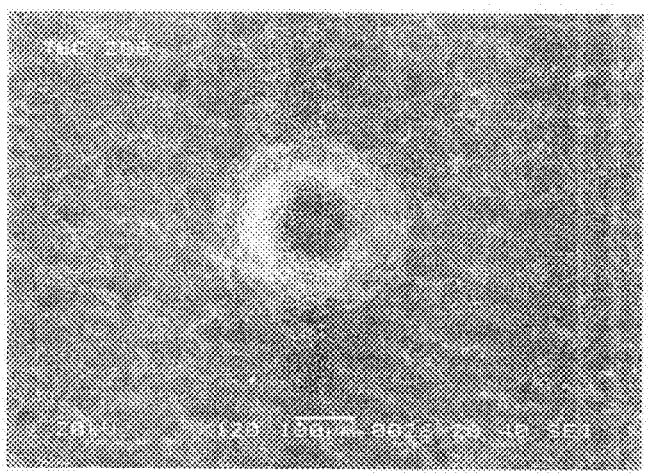
Figure 12C:
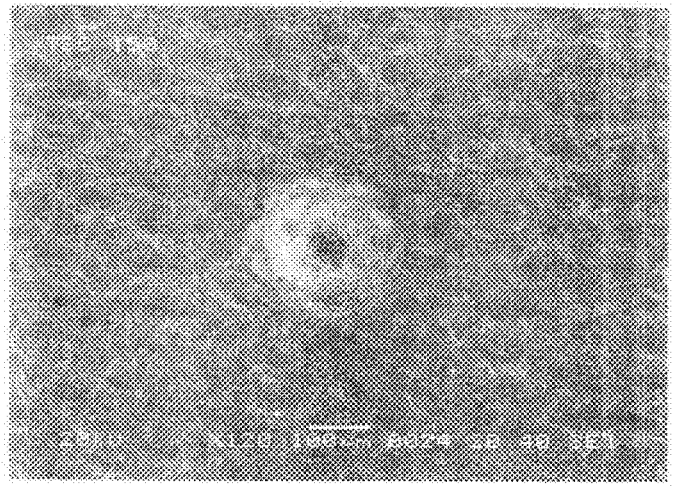

FIGS. 11A-11C are photomicrographs of an untextured wafer support pin, a wafer support pin textured with a cross-hatch pattern with 80 micron spacing, and a wafer support pin textured with a cross-hatch pattern with 50 micron spacing, respectively. The cross-hatch patterns cut into the Si/SiC ceramic with laser machined using a 1064 nm cold ablation laser at 15 W power with Argon cover gas.

The cross-hatched pattern reduces surface contact with the semiconductor wafer for reduced friction, reduced backside contamination and improved flatness. The use of laser ablation to form the cross-hatch pattern provides smaller feature sizes than conventional machining, enhanced tolerance capability compared to thermal laser cutting, and reduced thermal and mechanical damage induced into the cut surface.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation".

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various embodiments of the present invention.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

FIELD OF USE/INDUSTRIAL APPLICABILITY

The Applicant's laser machining technique is versatile and allows a wider variety (vs. EDM) of materials that can be processed. Features can be machined regardless of ceramic particle size in the composite. Many different compositions can be machined (e.g., composite materials containing multiple phases).

The techniques, apparatus and articles of the present invention should find utility in fabricating articles for the semiconductor fabrication industry, and particularly in fabricating the articles or components involved in handling semiconductor wafers. Such articles or components include:

Vacuum Wafer Chucks
Vacuum Wafer Tables
Electrostatic Chucks
Wafer Arms
End Effectors Other applications where heat-free or oxidation-free ceramic material removal is desired include:

Machining of next generation materials (i.e. Diamond based)
Anti-reflective texturing
Low friction texturing
Chemical-mechanical planarization (CMP) conditioner pad fabrication An artisan or ordinary skill will appreciate that various modifications may be made to the invention herein described without departing from the scope or spirit of the invention as defined in the appended claims.

What is claimed is:

1. A method of forming a surface of controlled roughness for handling a semiconductor wafer, said method comprising:
    (a) providing an article featuring an extremely flat surface, wherein the extremely flat surface is optically flat, and wherein the optically flat surface includes a ceramic-containing material, and wherein the ceramic-containing material of the optically flat surface includes silicon (Si);
    (b) providing a cold ablation laser;
    (c) providing an inert gas;
    (d) machining said optically flat surface by impinging a laser beam from said cold ablation laser onto said optically flat surface while directing a stream of said inert gas onto said optically flat surface at a location where said laser beam impinges on said optically flat surface, whereby said laser beam machines said optically flat surface, thereby forming the surface of controlled roughness, wherein the surface of controlled roughness has no visible oxidation and is recessed or relieved relative to said optically flat surface at said location; and
    (e) moving said laser beam relative to said optically flat surface, thereby relieving a portion of said optically flat surface, and leaving a balance of said optically flat surface unaffected.

2. The method of claim 1, wherein said cold ablation laser has a power in a range of 15 to 120 watts.

3. The method of claim 1, wherein said cold ablation laser operates at a wavelength between 150 and 1080 nm.

4. The method of claim 1 wherein said cold ablation laser has a pulse width between 1 femtosecond and 300 nanoseconds.

5. The method of claim 1 wherein said cold ablation laser has a repetition rate between 1 Hz and 100,000 Hz.

6. The method of claim 1 wherein said inert gas comprises a gas selected from the group consisting of helium, argon, neon, krypton, and xenon.

7. The method of claim 1, wherein said article comprises a chuck for supporting the semiconductor wafer.

* * * * *